(12) United States Patent
Behle et al.

(10) Patent No.: US 7,109,070 B2
(45) Date of Patent: Sep. 19, 2006

(54) PRODUCTION OF A COMPOSITE MATERIAL HAVING A BIODEGRADABLE PLASTIC SUBSTRATE AND AT LEAST ONE COATING

(75) Inventors: Stephan Behle, Hahnheim (DE); Matthias Bicker, Mainz (DE)

(73) Assignee: Schot Glas, Mainz (DE)

( * ) Notice: Subject to any disclaimer, the term of this patent is extended or adjusted under 35 U.S.C. 154(b) by 177 days.

(21) Appl. No.: 10/637,780

(22) Filed: Aug. 7, 2003

(65) Prior Publication Data

US 2004/0142184 A1    Jul. 22, 2004

Related U.S. Application Data

(63) Continuation-in-part of application No. PCT/EP02/08853, filed on Aug. 7, 2002.

(30) Foreign Application Priority Data

Dec. 13, 2002    (DE) ................ 102 58 680

(51) Int. Cl.
*H01L 21/00*    (2006.01)
*H01L 21/84*    (2006.01)

(52) U.S. Cl. ................ 438/149; 438/618; 349/117

(58) Field of Classification Search ................ 438/149, 438/458, 618, 780; 349/117, 122, 123, 162
See application file for complete search history.

(56) References Cited

U.S. PATENT DOCUMENTS 5,972,436 A * 10/1999 Walther ................ 427/535
6,398,960 B1 * 6/2002 Borden et al. ................ 210/610
2003/0113564 A1 * 6/2003 Noda et al. ................ 428/480

* cited by examiner

*Primary Examiner*—Phuc T. Dang

(57) ABSTRACT

To improve a biodegradable plastic substrate by applying a coating, the invention provides a process for producing a composite material in which a biodegradable plastic substrate is provided, which is coated on at least one surface with at least one barrier layer, the barrier layer being deposited by chemical vapor deposition.

44 Claims, No Drawings

PRODUCTION OF A COMPOSITE MATERIAL HAVING A BIODEGRADABLE PLASTIC SUBSTRATE AND AT LEAST ONE COATING

CROSS-REFERENCES TO RELATED APPLICATIONS

This application is a CIP of PCT/EP02/08853 filed Aug. 7, 2002.

BACKGROUND OF THE INVENTION

1. Field of the Invention

The invention relates in general terms to a process for applying a coating to a biodegradable plastic substrate, and specifically to a process for applying a coating of this type in which a three-dimensional body, in particular a hollow body, is used as a plastic substrate and at least one barrier layer is deposited on the surface of the plastic substrate, and also relates to a composite material produced using the process.

The invention also relates to a composite material comprising a three-dimensional biodegradable plastic substrate and at least one coating having at least one barrier layer which is applied by chemical vapor deposition.

2. Relevant Art

Biodegradable plastics are becoming increasingly important on account of the growing problems of disposing of in particular packaging waste. Biodegradable plastics can be broken down into their basic constituents by the combined action of heat, moisture and micro organisms. They do not represent critical problems when disposed of by land fill, combustion, composting and recycling.

The degradation generally forms carbon dioxide, water and biomass, which can be returned to the nutrient cycle for example via the compost.

Biodegradable plastics can be produced using a very wide range of technologies, both from renewable resources, i.e. from raw materials of animal or vegetable origin which regrow, and from fossil resources. The biodegradable property is a consequence of the chemical composition of the plastic and not of the origin of raw material.

Nowadays, the following groups of materials based on raw materials which regrow are among those available: starch and starch blend, polylactides (PLA), cellulose, cellulose acetate (CA), polyhydroxybutyrate/valerate (PHB/PHV), polyhydroxyalkanoates, cellulose film, viscose, animal and vegetable raw materials and residue materials, such as gelatin. Certain polyesters and copolyesters, polycaprolactone (PCL), certain polyesteramides, polyester urethanes and polyvinyl alcohol (PVAL) are known biodegradable plastics based on fossil raw materials.

Some biodegradable plastics, such as polyhydroxybutyrate/valerate, can be produced and enriched directly in micro organisms or in plants. Others are generated from natural raw materials; one example is polylactide, which is based on lactic acid building blocks.

Polylactides have long been known for medical applications. They are considered to have good technological chances of economic production as future mass-produced plastics. Polylactides can be prepared using all conventional plastics processing methods and can therefore be used for a very wide range of products. Examples include thermoformed packaging materials, foamed shaped bodies, film packaging materials, woven fabrics, nonwovens, wound coverings and stretch blow molded hollow bodies.

Polyhydroxybutyrate has also long been known from the medical sector. In particular the specific properties of compatibility and degradability even in the human body are of interest for its use in implants, stitches, stitching and bandaging material and pharmaceutical capsules.

Further biodegradable plastics are being developed in particular for foodstuff packaging, but also generally in sectors in which biodegradability constitutes an advantage in use, for example in agriculture and forestry and in horticulture, as well as wherever the plastic is highly mixed with organic waste, so that its separation and conventional plastic recycling are not suitable. One example is thermoplastic starch.

The use of pure thermoplastic starch as a material is prevented by its extremely strong hydrophilicity. Therefore, to produce a thermoplastic material based on starch, it is necessary to modify the starch in order to make the material resistant to water and less sensitive to moisture. One possible way of doing this is to produce polymer mixtures with a water-resistant polymer.

The processing and use properties of the biodegradable plastics are often improved by additives, such as for example plasticizers or lubricants. Fillers are used to satisfy both optical and economic requirements. Therefore, finished products are often composite materials comprising different components. However, if the biodegradability or combustibility is to be retained, this factor must always be borne in mind when selecting the processes and/or materials.

To make it possible to dispense with the use of polymer blends when producing biodegradable plastics with satisfactory use properties, it is advantageous to provide plastic substrates with a barrier coating, in order to ensure a reduction in the permeation of gases and liquids, and furthermore to protect the plastics material from chemical attacks or UV radiation.

German Patent Document DE 199 544 03 A1 describes a multilayer biodegradable film with improved barrier properties with respect to oxygen and water vapor and also a process for producing it and its use. The improvement to the barrier action is achieved by providing the biodegradable film with a layer of a biologically harmless nonpolymeric material. The coating is in this case preferably applied by evaporation coating in vacuo, with the evaporation coating medium being evaporated thermally or by electron beams. The evaporated material can be activated before it actually comes into contact with the film surface by generating a plasma discharge in the material in vapor form using microwave radiation which has been introduced.

In practice, however, it has been found that known coating processes, when they are used to apply barrier layers to biodegradable plastic substrates, result in a considerable deterioration in the material properties of the plastic substrate. On account of the relatively low glass transition temperature of the biodegradable plastics, which is generally below 80° C., for example in the case of polylactides is 55° C., the material is softened on account of the higher temperatures used during the coating operation. Known processes fail in particular when they are used to coat shaped plastic bodies, since the shaped bodies readily lose their shape on account of the softening which occurs during coating.

SUMMARY OF THE INVENTION

Therefore, it is an object of the invention to improve a biodegradable plastic substrate by the application of a coating.

This object is achieved in a surprisingly simple way by a process according to the invention. The object is achieved by a composite material which can be produced using the process according to the invention.

The process according to the invention for producing a composite material comprises the steps of providing a biodegradable plastic substrate and coating the plastic substrate on at least one surface with at least one barrier layer, the barrier layer being deposited by chemical vapor deposition (CVD). The biodegradable plastic substrate may be in any desired form; hollow bodies such as in particular containers are especially suitable.

The invention therefore for the first time provides a process which enables three-dimensional bodies made from a biodegradable plastic to be coated with a barrier layer on both their inner side and their outer side. This is achieved by using chemical vapor deposition to coat the biodegradable substrate.

In the text which follows, the term "coating" refers to the system which is deposited on the biodegradable substrate. This system may comprise a single layer or a plurality of layers.

There is provision to use a plasma which is generated in a gas atmosphere which comprises at least one precursor to be used to apply the coating. This opens up the possibility of adjusting the properties of the barrier coating by suitable selection of the at least one precursor. Barrier coatings of a plastic substrate of this type are described for conventional plastics in applications PCT/EP02/088853 and the two simultaneously filed applications in the name of the present Applicant entitled "Process for producing smooth barrier layers and composite material with smooth barrier layer" and "Rapid process for producing multilayer barrier layers". The content of disclosure of these documents is incorporated in its entirety by reference in the present application.

In the context of the process according to the invention, it is appropriate to use a low-temperature plasma, in order to allow material-preserving coating of temperature-sensitive biodegradable plastic substrates.

Depending on the requirements imposed on the properties of the coating and on the economic viability of the process, it may be expedient to use a non-equilibrium plasma. In particular, it is possible to deliberately produce different reaction products in the non-equilibrium plasma than in the equilibrium state of the plasma. Therefore, by using the non-equilibrium plasma it is possible to influence the composition of the coatings which form.

In order at the same time not to damage the biodegradable plastic substrate by the use of excessively high temperatures in the plasma while nevertheless providing the plasma activation energy which is required to generate the coatings, the invention advantageously provides for the use of a pulsed plasma.

The use of a plasma-enhanced CVD process, a so-called PICVD process, results in the required good adhesion of the barrier coatings as well as an excellent barrier action with respect to constituents from the atmosphere, substances contained in plastic or substances released from plastic, as well as substances which are in contact with the surface of the composite material. In particular, the use of a PICVD process allows low surface temperatures to be achieved during coating, i.e. thermally sensitive plastics can be provided with an excellent barrier coating without the plastic surface being damaged.

Furthermore, the PICVD process can be used to apply very thin films, even down to monomolecular layers, which have barrier properties, to a substrate material. This allows a considerable saving on material. Moreover, layers of this type are distinguished by a high degree of flexibility.

For a pulsed plasma, what is known as the duty ratio is defined as the ratio of the pulse duration to the pulse space interval. According to the invention, by suitably selecting the duty ratio it is possible to provide the required activation energy in the plasma during the pulse phase yet nevertheless keep the temperature in the plasma at a low level even if relatively long coating times are required for correspondingly large substrates. According to the invention, the duty ratio is selected to be in the range from 0.01% to 10%.

The electromagnetic energy which is required to ignite and maintain the plasma can advantageously be time-modulated. Therefore, the invention provides a further parameter which allows the energy introduced into the plasma to be controlled or adjusted, so that it is possible to establish an optimum between the required activation energy of the plasma, on the one hand, and the minimum possible temperature, on the other hand.

The time modulation of the electromagnetic energy for generating the plasma can in this case be effected in such a manner that square-wave and/or triangular and/or sinusoidal pulses are formed. Suitably selecting the modulation profile advantageously makes it possible to adapt to the temperature limits which are predetermined by the type of coating and the type of substrate.

The electromagnetic energy for igniting and maintaining the plasma can be provided in a simple way in the form of direct current pulses of predeterminable frequency and/or in the form of alternating current. The direct current pulses of predeterminable frequency can be provided, for example, by rectifying alternating current. The process according to the invention can therefore be carried out in a surprisingly simple way using conventional sources for electromagnetic energy to generate the plasma.

The frequency range of the electromagnetic energy may lie in the low-frequency range, in particular at frequencies between 30 kHz and 300 kHz, and/or in the high-frequency range, in particular at frequencies between 3 MHz and 30 MHz, and/or in the microwave range, in particular at frequencies between 0.3 GHz and 300 GHz.

If high frequencies are used, it is possible to introduce a greater amount of energy per unit time. The use of low frequencies offers the advantage, in the case of large workpieces, that on account of the large wavelength the formation of vibration nodes on the workpiece can be avoided and it is therefore possible to prevent the vibration nodes from being imaged in the coating.

According to the invention, the values for the pulse frequency are in the range from 0.01 kHz to 10 kHz. To enable a low thermal load to be achieved with otherwise given process parameters, a low pulse frequency is advantageous.

In the case of pulses in the form of a sine wave, a low pulse frequency corresponds to a long pulse duration, and it is therefore possible to introduce high levels of energy during a pulse. With a high frequency, i.e. a short pulse duration, it is possible to produce particularly pure layers. Few reaction products are produced with a short pulse duration, on account of the short reaction time.

In the following pulse space interval, it is possible to remove these reaction products by exchanging the process gas. The reaction products could constitute impurities in the layers, and consequently removing them from the coating process entails advantages with regard to the quality of layers which are deposited.

The process according to the invention can be used to apply the coating to the inside and/or outside of a biodegradable plastic substrate.

Therefore, the process according to the invention for the first time provides a way of providing a three-dimensional substrate made from biodegradable plastic with a barrier layer on any desired surfaces. For example, depending on the use of the coated biodegradable plastic substrate, it is possible to in each case separately and deliberately establish a barrier action with respect to the product with which the substrate is filled and/or a barrier action with respect to the environment.

The invention provides various options for the configuration of the coating. Firstly, the coating can be applied as an organic and/or inorganic single layer. The barrier action of the plastic can be significantly improved even by a single layer of this nature.

If relatively high demands are imposed on the barrier action, according to the invention the coating can be applied as a gradient system. Gradient layers of this nature have a stochiometric or structural variation of a parameter in a direction perpendicular to the surface of the substrate.

The gradient layer results in improved adhesion combined, at the same time, with a high barrier action as a result of at least one of the parameters comprising pulse duration and/or pulse space interval and/or electromagnetic power and/or precursor flow and/or flow of an auxiliary gas being altered continuously or in steps during the layer growth.

Improved adhesion combined, at the same time, with a high barrier action of the coating can be achieved in a simpler way by an organic adhesion promoter layer in combination with at least one barrier layer being applied as a coating.

A particularly high barrier action with respect to different components can be achieved with a coating which comprises an alternating layer system comprising alternating organic and inorganic layers. In order, at the same time, to improve the adhesion to the substrate, a coating of this type can also advantageously be applied to an adhesion promoter layer.

It is advantageously possible for at least one further coating process to be employed in combination with the process described. This in particular allows the coated substrate, depending on the particular application, to be provided with a coat of colored paint, written on and/or labeled.

In addition to the process, the invention for the first time provides a composite material comprising a three-dimensional biodegradable plastic substrate and at least one coating having at least one barrier layer which can be applied by chemical vapor deposition.

To satisfy the different demands imposed by the particular application areas, the coating may include an organic and/or inorganic single layer, may comprise a gradient system, may include an organic adhesion promoter layer in combination with at least one barrier layer or may consist of alternating organic and inorganic layers, if appropriate in conjunction with an adhesion promoter layer.

The coating may in particular contain a carbon-containing adhesion promoter, in order in this way to achieve particularly good adhesion of the coating to the biodegradable substrate. In connection with the process according to the invention, it has proven advantageous for the carbon-containing adhesion promoter to comprise silicon, oxygen, carbon and hydrogen; Si, O, C and H may be present in any desired quantitative ratios, meaning that in a compound $SiO_xC_yH_z$ the values of the stochiometric factors x, y and z can be selected as desired.

The composite material has a coating which is composed of an environmentally friendly layer system. Therefore, the invention provides a composite material which overall is gentle on the environment. In particular, the coating and also the composite material may advantageously be food-compatible.

The coating may in particular contain $SiO_x$, and/or $TiO_x$ with the stochiometric factor x in the range from 1 to 2 and amorphous hydrogenated carbon (a:C—H).

These constituents of the coating have the advantage that they can be deposited using the process according to the invention, adhere well to the biodegradable substrate and at the same time have a high barrier action, and moreover cause no problems whatsoever with regard to disposal.

Furthermore, the invention provides for the coating itself to be biodegradable. Therefore, the invention can for the first time provide a biodegradable composite material having a high barrier action.

The invention allows the use of biodegradable substrates made from a plastic with a glass transition temperature $T_g<80°$ for the composite material. This means that in particular polylactides, of which there is already extensive experience in terms of their production and use properties but which it has hitherto been impossible to provide with barrier layers on account of their high temperature sensitivity, may be present in the composite material according to the invention.

Depending on the particular application, it is possible to select different biodegradable substrates for the composite material, so that the invention can be used within a wide range. In particular, there is provision to select a plastic which is selected from the group consisting of polylactide polymers, polyester amide, polyactic acid, polyhydroxybutyrate/valerate, thermoplastic starch and plastic formed from the combination of starch, cellulose and additives, as biodegradable substrate for the composite material.

The composite material according to the invention may be flexibly matched to the particular requirements and use areas by at least one colored paint, labeling or writing being applied to the coated composite material. Furthermore, there is provision for at least two composite materials according to the invention to be combined with one another.

The invention is described in more detail below with reference to exemplary embodiments.

Three-dimensional substrates made from biodegradable plastics may be disposable plates, dishes, etc., disposable cutlery, packaging materials, bottles and containers of all kinds, such as for example bags. A wide range of applications in particular in the food sector is opened up if substrates of this type are processed by the application of a coating using the process according to the invention to form a composite material which has a high barrier action in particular with respect to water vapor and atmospheric oxygen.

The following embodiment describes an internal coating of a biodegradable 0.5 l bottle with an adhesion promoter/barrier composite:

A bottle made from polylactic acid (PLA) with a filling volume of 0.5 l is simultaneously evacuated on the outer side to a pressure of 10 mbar and pumped out on the inner side initially to a basic pressure of below 0.1 mbar. Then, a mixture of oxygen and hexamethyldisilazane (HMDSN) is passed into the interior of the bottle at a pressure of 0.3 mbar. Then, pulsed microwave energy with a frequency of 2.45 GHz is introduced and a plasma is ignited in the container.

First of all, an organic adhesion promoter layer is applied at an HMDSN concentration of 20% and a total flow rate of 50 sccm. The pulse power is 945 W, the pulse duration is 0.5 ms, and the pulse space interval is 10 ms.

This is followed by a rapid gas change to a lower HMDSN concentration of 0.8%, and a second, inorganic barrier layer is applied at the same predetermined pressure, an oxygen flow rate of 130 sccm and a pulse duration of 3 ms, a pulse space interval of 120 ms and a pulsed power of 3600 W.

The inorganic layer is deposited under hard plasma conditions, so that its carbon content is below 6%.

Table 1 shows three different embodiments for different layer thicknesses for the organic adhesion promoter layer and the inorganic barrier layer.

The $H_2O$-BIF indicates the barrier improvement factor for water vapor, which results from the ratio of the permeation through the uncoated container and the permeation through the coated container. To measure the permeation, the containers are filled with 250 ml of water and are tightly closed. The decrease in weight over the course of several weeks is measured by weighing measurements, and the water vapor permeation is determined from these measurements.

All the variants shown in Table 1 lead to a significant barrier improvement to water vapor. The highest barrier action is achieved for a 20 nm thick adhesion promoter layer and 25 nm thick barrier layer. The result is a $H_2O$-BIF of 12.6 at room temperature, measured at 50% atmospheric humidity, and of 7.3 at 45° C. and unregulated humidity.

A further embodiment is shaped parts made from biodegradable plastics provided with a barrier layer for use as wrapping materials which are used to package materials in piece form on pallets, to package smaller units or as intermediate pieces.

The biodegradable plastic substrates which have been coated in accordance with the invention can also be used as shaped plastic parts for the inner packaging of products, in particular for fixing products in place in boxes. The invention makes it possible to provide environmentally friendly alternatives to products made from conventional plastics by using foamed substrates made from biodegradable plastics which are provided with a barrier layer in particular for inner packaging materials for technical equipment such as monitors, computers, television sets, video recorders, lamps and all types of domestic appliances even through to fillers (known as flow chips).

The invention claimed is:

1. A process for producing a composite material, comprising the following steps:
   providing a biodegradable plastic substrate;
   coating at least one surface of the biodegradable plastic substrate with at least one barrier layer,
   wherein the barrier layer is deposited by chemical vapor deposition, and using a non-equilibrium plasma which is generated in a gas atmosphere which comprises at least one precursor to apply the coating.

TABLE 1 embodiments for different layer thicknesses for organic adhesion promoter layers and inorganic barrier layers

| Ex No. | Adhesion promoter layer thickness [nm] | Barrier layer thickness [nm] | $H_2O$ permeation [mg/day], 23° C., 50% humidity | $H_2O$—BIF, 23° C., 50% humidity | $H_2O$ permeation [mg/day], 45° | $H_2O$—BIF, 45° C. |
|---|---|---|---|---|---|---|
| Reference, uncoated | — | — | 250.8 | — | 1298.1 | — |
| 1 | 10 | 25 | 44.1 | 5.7 | 248.1 | 5.2 |
| 2 | 20 | 25 | 20.2 | 12.6 | 179.1 | 7.3 |
| 3 | 10 | 12.5 | 36.7 | 6.8 | 323.0 | 4.0 |

Further examples are thermoformed packaging materials for cold foodstuffs, such as yogurt or soft cheese, foamed trays for fruit, vegetables or meat and containers for cookies, candy or bulk materials (noodles, rice, sugar, etc).

It is also possible to produce disposable plates, dishes, etc. and disposable cutlery from biodegradable plastics with a barrier action. By way of example, transparent cups which, with a transparent barrier coating, can be used as disposable glasses can be produced from polylactic acid. They are lightweight, dimensionally stable, biodegradable and are suitable for both cold and hot beverages.

Plates and dishes for cold and hot food can be produced from starch and cellulose. A barrier coating makes them watertight or water-impermeable. They are able to withstand temperatures of from −40° C. to at least 120° C. and are suitable for use in the microwave, in a fan oven or for steaming.

A further example is cutlery made from thermoplastic plant starch and cellulose derivatives with a barrier coating. This cutlery is heat-resistant between 60° C. and 120° C. The barrier coating prevents softening by preventing the penetration of water from the food into the cups, plates, dishes and cutlery.

2. The process as claimed in claim 1, wherein the plastic substrate comprises a hollow body.

3. The process as claimed in claim 1, comprising pulsing the plasma with a duty ratio with a value in the range from 0.01% to 10%.

4. The process as claimed in claim 1, wherein the electromagnetic energy for generating the plasma is time-modulated.

5. The process as claimed in claim 4, wherein square-wave, triangular, or sinusoidal pulses are formed by time modulation of the electromagnetic energy for generating the plasma.

6. A process for producing composite material, compromising the following steps:
   providing a biodegradable plastic substrate;
   coating at least one surface of the biodegradable plastic substrate with at least one barrier layer,
   wherein the barrier layer is deposited by chemical vapor deposition,
   using a plasma which is generated in a gas atmosphere which comprises at least one precursor to apply the coating, wherein the electromagnetic energy for generating the plasma is provided in a form of direct current pulses of predeterminable frequency in a form of alternating current.

7. A process for producing a composite material, comprising the following steps:
providing a biodegradable plastic substrate;
coating at least one surface of the biodegradable plastic substrate with at least one barrier layer,
wherein the barrier layer is deposited by chemical vapor deposition,
using a pulsed plasma which is generated in a gas atmosphere which comprises at least one precursor to apply the coating,
wherein a frequency range of the electromagnetic energy is in a low-frequency range, at frequencies between 30 kHz and 300 kHz, or in the high-frequency range, at frequencies between 3 MHz and 30 MHz, or in a microwave range, at frequencies between 0.3 GHz and 300 GHz.

8. The process as claimed in claim 1, wherein values for the pulse frequency are in a range from 0.01 kHz to 10 kHz.

9. The process as claimed in claim 2, in which the biodegradable plastic substrate comprises a hollow body, wherein the biodegradable plastic substrate is internally or externally coated.

10. The process as claimed in claim 1, wherein an organic or inorganic single layer is applied as coating.

11. The process as claimed in claim 1, wherein a gradient system is applied as coating.

12. The process as claimed in claim 1, wherein an organic adhesion promoter layer in combination with at least one barrier layer is applied as coating.

13. The process as claimed in claim 1, wherein a coating which comprises an alternating layer system with alternating organic and inorganic layers is applied.

14. The process as claimed in claim 1, wherein at least one further coating process is used in addition or in combination with the process as claimed in claim 1.

15. A composite material, which is produced using the process as claimed in claim 1.

16. A composite material which comprises a biodegradable plastic substrate and at least one coating having at least one barrier layer which has been applied by chemical vapor deposition, wherein the coating includes an organic or inorganic single layer.

17. The composite material as claimed in claim 16, wherein the coating includes a gradient system.

18. The composite material as claimed in claim 16, wherein the coating includes an organic adhesion promoter layer in combination with at least one barrier layer.

19. The composite material as claimed in claim 16, wherein the coating comprises a carbon-containing adhesion promoter.

20. The composite material as claimed in claim 19, wherein the carbon-containing adhesion promoter contains $SiO_xC_yH_z$.

21. The composite material as claimed in claim 16, wherein the coating includes an alternating layer system having alternating organic and inorganic layers.

22. The composite material as claimed in claim 16, wherein the coating comprises an environmentally friendly material, in particular food-compatible material.

23. The composite material as claimed in claim 16, wherein the coating contains at least one of $SiO_x$ and $TiO_x$, where x is in the range from 1 or 2, and amorphous hydrogenated carbon.

24. The composite material as claimed in claim 16, wherein the coating is biodegradable.

25. The composite material as claimed in claim 24, wherein the biodegradable substrate comprises a plastic with $T_g<80°$ C.

26. The composite material as claimed in claim 24, wherein the biodegradable substrate contains at least one plastic which is selected from the group consisting of polylactide polymers, polyesteramide, polylactic acid, polyhydroxybutyrate/valerate, thermoplastic starch, plastics comprising the combination of starch, cellulose and additives.

27. The composite material as claimed in claim 16, which includes at least one further coating.

28. The composite material as claimed in claim 16, wherein at least two composite materials as claimed in claim 21 are combined with one another.

29. The composite material as claimed in claim 15, wherein the coating includes an organic or inorganic single layer.

30. The composite material as claimed in claim 15, wherein the coating includes a gradient system.

31. The composite material as claimed in claim 15, wherein the coating includes an organic adhesion promoter layer in combination with at least one barrier layer.

32. The composite material as claimed in claim 15, wherein the coating comprises a carbon-containing adhesion promoter.

33. The composite material as claimed in claim 32, wherein the carbon-containing adhesion promoter contains $SiO_xC_yH_z$.

34. The composite material as claimed in claim 15, wherein the coating includes an alternating layer system having alternating organic and inorganic layers.

35. The composite material as claimed in claim 15, wherein the coating comprises an environmentally friendly material, in particular food-compatible material.

36. The composite material as claimed in claim 15, wherein the coating contains at least one of $SiO_x$ and $TiO_x$, where x is in the range from 1 to 2, and amorphous hydrogenated carbon.

37. The composite material as claimed in claim 15, wherein the coating is biodegradable.

38. The composite material as claimed in claim 15, wherein the biodegradable substrate comprises a plastic with $T_g5<80°$ C.

39. The composite material as claimed in claim 15, wherein the biodegradable substrate contains at least one plastic which is selected from the group consisting of polylactide polymers, polyesteramide, polylactic acid, polyhydroxybutyrate/valerate, thermoplastic starch, plastics comprising the combination of starch, cellulose and additives.

40. The composite material as claimed in claim 15, which includes at least one further coating.

41. The composite material as claimed in claim 15, wherein at least two composite materials as claimed in claim 15 are combined with one another.

42. A process for producing a composite material, comprising the following steps:
providing a biodegradable plastic substrate,
coating at least one surface of the biodegradable plastic substrate with at least one barrier layer,
wherein the barrier layer is deposited by chemical vapor deposition, using a low-temperature plasma which is generated in a gas atmosphere which comprises at least one precursor to apply the coating.

43. A process for producing a composite material, comprising the following steps:
provide a biodegradable plastic substrate,
coating at least one surface of the biodegradable plastic substrate with at least one barrier layer,
wherein the barrier layer is deposited by chemical vapor deposition,
using a pulsed plasma which is generated in a gas atmosphere which comprises at least one precursor to apply the coating.

44. A process for producing a composite material, comprising the following steps:
providing a biodegradable plastic substrate,
coating at least one surface of the biodegradable plastic substrate with at least one barrier layer,
wherein the barrier layer is deposited by chemical vapor deposition,
using a plasma which is generated in a gas atmosphere which comprises at least one precursor to apply the coating.

* * * * *